(12) United States Patent
Seo et al.

(10) Patent No.: US 7,701,002 B2
(45) Date of Patent: Apr. 20, 2010

(54) SEMICONDUCTOR DEVICE HAVING BURIED GATE ELECTRODE AND METHOD OF FABRICATING THE SAME

(75) Inventors: Hyeong-Won Seo, Yongin-si (KR); Jae-Man Yoon, Seoul (KR); Kang-Yoon Lee, Seongnam-si (KR); Young-Woong Son, Hwaseong-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 571 days.

(21) Appl. No.: 11/608,482

(22) Filed: Dec. 8, 2006

(65) Prior Publication Data

US 2008/0003753 A1 Jan. 3, 2008

(30) Foreign Application Priority Data

Jun. 28, 2006 (KR) ............... 10-2006-0058838

(51) Int. Cl.
*H01L 27/108* (2006.01)
*H01L 29/94* (2006.01)

(52) U.S. Cl. .............. 257/330; 257/331; 257/332; 257/401; 438/243; 438/248; 438/259; 438/391; 438/386; 438/387

(58) Field of Classification Search ............. 257/330, 257/331, 332, 401; 438/209, 268, 270, 272, 438/210, 243, 244, 248, 259, 391, 386, 387, 438/700

See application file for complete search history.

(56) References Cited

U.S. PATENT DOCUMENTS

| 6,770,535 | B2 | 8/2004 | Yamada et al. | |
|---|---|---|---|---|
| 7,459,741 | B2 * | 12/2008 | Kidoh et al. | 257/296 |
| 7,470,588 | B2 * | 12/2008 | Cho et al. | 438/272 |
| 2005/0017030 | A1 | 1/2005 | Patz | |
| 2005/0032322 | A1 | 2/2005 | Kim et al. | |
| 2005/0173759 | A1 | 8/2005 | Kim et al. | |
| 2005/0260814 | A1 * | 11/2005 | Cho et al. | 438/257 |
| 2007/0057328 | A1 * | 3/2007 | Taniguchi et al. | 257/368 |
| 2007/0173007 | A1 * | 7/2007 | Lee et al. | 438/209 |
| 2008/0061322 | A1 * | 3/2008 | von Kluge | 257/213 |
| 2008/0121961 | A1 * | 5/2008 | Schloesser | 257/302 |

* cited by examiner

*Primary Examiner*—Thao X Le
*Assistant Examiner*—Thanh Y Tran
(74) *Attorney, Agent, or Firm*—F. Chau & Associates, LLC

(57) ABSTRACT

A semiconductor device includes an isolation layer disposed in a semiconductor device to define an active region. A gate trench is disposed across the active region and extends to the isolation layer. An insulated gate electrode fills a portion of the gate trench and covers at least one sidewall of the active region. A portion of the gate electrode, that covers at least one sidewall of the active region, extends under a portion of the gate electrode that crosses the active region. An insulating pattern is disposed on the gate electrode.

18 Claims, 13 Drawing Sheets

SEMICONDUCTOR DEVICE HAVING BURIED GATE ELECTRODE AND METHOD OF FABRICATING THE SAME

This application claims the benefit of Korean Patent Application No. 2006-0058838, filed Jun. 28, 2006, the contents of which are hereby incorporated by reference herein in their entirety.

BACKGROUND OF THE INVENTION

1. Technical Field

The present disclosure relates to a semiconductor device and to a method of fabricating the same, and more particularly, to a semiconductor device having a buried gate electrode and to a method of fabricating the same.

2. Description of Related Art

Driven by an increased demand for highly integrated semiconductor devices, extensive research has been conducted into minimizing the areas of components such as, for example, transistors. With the downscaling of a transistor, the channel length and the channel width may also need to be decreased as well. However, a reduction in effective channel width may also lead to a drop in channel current, thereby lowering the current driving capability of the transistor. Also, a reduction in effective channel length may cause not only an increase in the channel current but may also lead to other difficulties, such as, for example, a short channel effect.

A recess-channel metal oxide semiconductor field effect transistor (MOSFET) has been proposed to overcome the short channel effect and downscale the transistor. The recess-channel MOSFET includes a recessed channel region and an insulated gate electrode. The insulated gate electrode is disposed on the recessed channel region. Thus, the recess-channel MOSFET can have a larger effective channel length than a planar MOSFET. In other words, the recess-channel MOSFET has an improved structure that diminishes difficulties caused by the short channel effect.

However, when the insulated gate electrode protrudes over a semiconductor substrate, the recess-channel MOSFET may preclude subsequent processes, such as, for example, the formation of a contact plug and a planarization process. Also, upper corners of the recessed channel region may cause the occurrence of leakage current due to a field crowding effect. Further, formation of the protruding gate electrode involves a very complicated patterning process.

In an attempt to overcome the above-mentioned difficulties, a semiconductor device having a buried word line was researched and is described in U.S. Pat. No. 6,770,535 B2, entitled "Semiconductor Integrated Circuit Device and Process for Manufacturing the Same", by Yamada et al.

According to Yamada et al., a trench is formed across a channel region and an isolation layer. A word line is formed to fill a portion of the trench. An insulating pattern is formed to fill the remaining portion of the trench. As a result, the word line is buried underneath a semiconductor substrate. The buried word line provides a relatively longer effective channel length.

However, the effective channel width of the semiconductor device described in U.S. Pat. No. 6,770,535 B2 is dependent upon the channel region and the buried word line. Thus, the semiconductor device having the buried word line has substantially the same effective channel width as a planar MOSFET. As a result, the semiconductor device having the buried word line may be inferior to the planar MOSFET in current driving capability. For examples lowering of current driving capability may make it difficult to elevate the integration density of the semiconductor device.

Furthermore, the recess-channel MOSFET may have certain structural difficulties compared to the planar MOSFET in terms of a body effect, for example, an increase in threshold voltage.

In conclusion, there is a need in the art for an improved transistor and fabrication technique that adopt a buried word line and diminish the difficulties caused by a body effect.

SUMMARY OF THE INVENTION

An exemplary embodiment of the invention provides a semiconductor device that has a beneficial structure with respect to high integration and which can diminish the difficulties associated with a body effect.

Another exemplary embodiment of the invention provides a method of fabricating a semiconductor device that has a structure beneficial with respect to high integration and which can diminish difficulties associated with a body effect.

In accordance with an exemplary embodiment of the present invention, a semiconductor device is provided. The device includes an isolation layer disposed in a semiconductor device to define an active region. A gate trench is disposed across the active region and extends to the isolation layer. An insulated gate electrode fills a portion of the gate trench and covers at least one sidewall of the active region. A portion of the gate electrode, which covers at least one sidewall of the active region, extends under a portion of the gate electrode, which crosses the active region. An insulating pattern is disposed on the gate electrode.

In some exemplary embodiments of the present invention, the gate trench may include an upper trench an intermediate trench, and a lower trench. The intermediate trench may be disposed under the upper trench and have a larger width than the upper trench. The lower trench may be disposed under the intermediate trench and expose the sidewall of the active region. Also, a sidewall spacer may cover a portion of the active region exposed by the upper trench. However, the sidewall spacer may be omitted.

In other exemplary embodiments, the gate electrode may cover the sidewall of the active region exposed by the lower trench. A portion of the gate electrode, which extends into the isolation layer, may be thicker than the portion of the gate electrode, which crosses the active region.

In still other exemplary embodiments, the insulating pattern may fill the remaining portion of the gate trench.

In yet other exemplary embodiments, source and drain regions may be disposed in the active region on both sides of the gate electrode, respectively. The top surfaces of the source and drain regions may be at a higher level than the gate electrode. Also, the top surfaces of the source and drain regions may be at substantially the same level as the top surface of the insulating pattern.

In yet other exemplary embodiments, a storage capacitor may be electrically connected to one of the source and drain regions.

In accordance with an exemplary embodiment of the present invention a method of fabricating a semiconductor device is provided. The method includes forming an isolation layer defining an active region in a semiconductor substrate. A gate trench is formed across the active region and extends to the isolation layer. An insulated gate electrode is formed to fill a portion of the gate trench and cover at least one sidewall of the active region. A portion of the gate electrode, which covers at least one sidewall of the active region, extends under a portion of the gate electrode, which crosses the active region. An insulating pattern is formed on the gate electrode.

In some exemplary embodiments of the present invention, forming the gate trench may include forming a mask pattern to partially expose the active region and the isolation layer. The active region and the isolation layer may be partially etched using the mask pattern as an etch mask, thereby forming an upper trench. An intermediate trench and a lower trench may be formed under the upper trench. The lower trench may be formed under the intermediate trench and expose the sidewall of the active region.

In other exemplary embodiments, a sidewall spacer may be formed on a portion of the active region exposed by the upper trench. The sidewall spacer may be formed of a material having an etch selectivity with respect to the active region and the isolation layer.

In still other exemplary embodiments the intermediate trench may extend using an isotropic etching process after forming the intermediate trench. Also, the lower trench may extend by etching the isolation layer using an isotropic etching process after forming the lower trench.

In yet other exemplary embodiments, forming the insulated gate electrode may include forming a gate dielectric layer on inner walls of the gate trench, A preliminary gate electrode may be formed to fill the gate trench. The preliminary gate electrode may be etched back to form the insulated gate electrode. The gate electrode may be formed of one selected from the group consisting of a polysilicon layer, a metal silicide layer, a metal layer, and a combination thereof.

In yet other exemplary embodiments, forming the insulating pattern may include forming an insulating layer to fill the remaining portion of the gate trench and cover the semiconductor substrate. The insulating layer may be planarized to form the insulating pattern.

In yet other exemplary embodiments, source and drain regions may be formed in the active region on both sides of the gate electrode. The top surfaces of the source and drain regions may be higher than the gate electrode.

BRIEF DESCRIPTION OF THE DRAWINGS

Exemplary embodiments of the present invention can be understood in more detail from the following description taken in conjunction with the accompanying drawings.

DETAILED DESCRIPTION OF THE EXEMPLARY EMBODIMENTS

Figure 1:
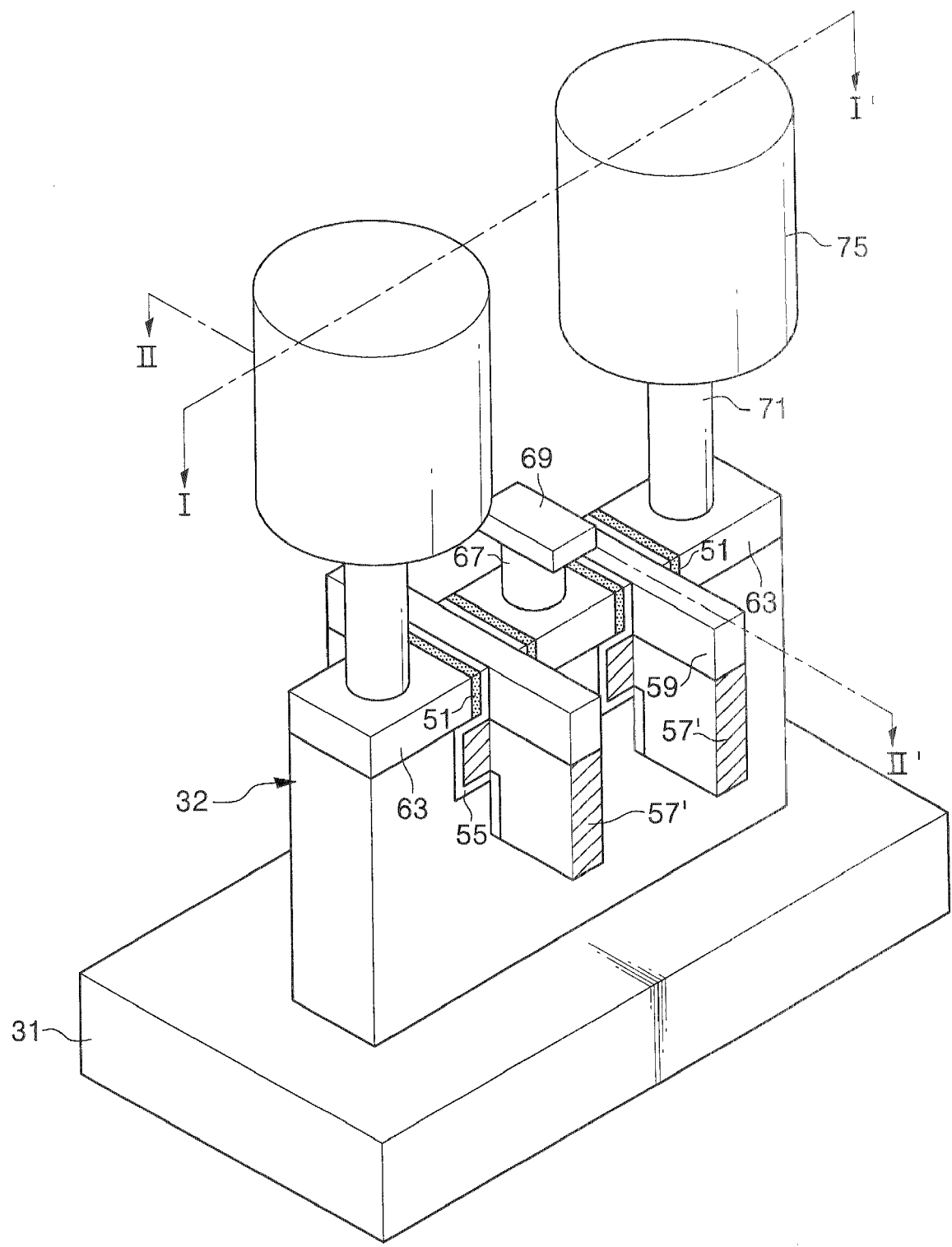
FIG. 1 is a perspective view of a portion of a DRAM having a buried gate electrode according an exemplary embodiment of the present invention.

The present invention will now be described more fully hereinafter with reference to the accompanying drawings, in which exemplary embodiments of the invention are shown. This invention may however, be embodied in different forms and should not be construed as limited to the exemplary embodiments set forth herein. In the drawings, the thicknesses of layers and regions are exaggerated for clarity. It will also be understood that when a layer is referred to as being "on" another layer or substrate, it can be directly on the other layer or substrate or intervening layers may also be present. The same reference numerals are used to denote the same elements.

Figure 11:
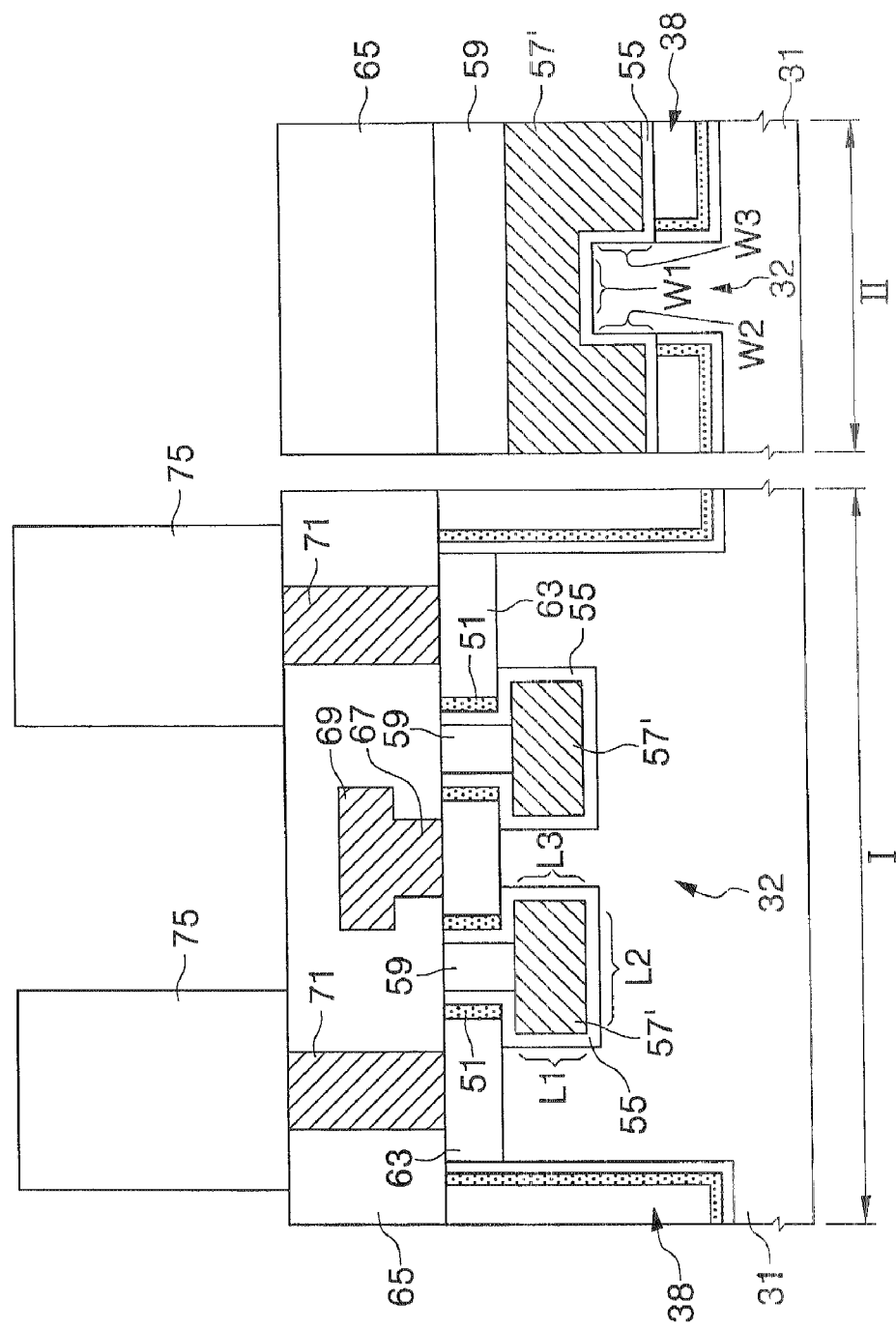

First, a dynamic random access memory (DRAM) having a buried gate electrode according to an exemplary embodiment of the present invention will be described with reference to FIGS. 1, 2, and 11. In FIG. 11, a region "I" is a cross-sectional view taken along line I-I' of FIG. 1, and a region "II" is a cross-sectional view taken along line II-II' of FIG. 1.

Figure 2:
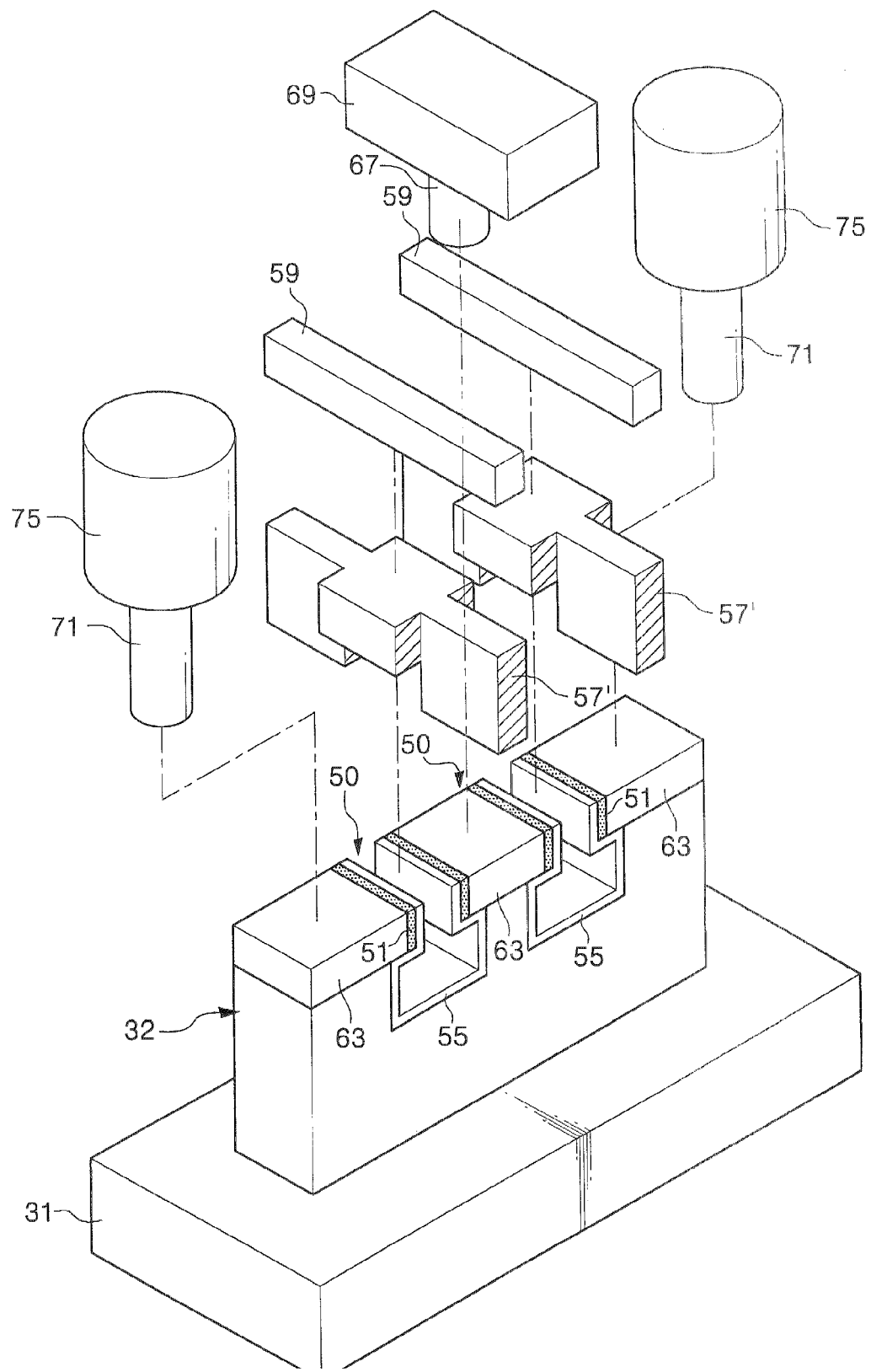
FIG. 2 is an exploded perspective view of the portion of the DRAM shown in FIG. 1.

Referring to FIGS. 1, 2, and 11, an isolation layer 38 is provided in a semiconductor substrate 31 to define an active region 32.

The semiconductor substrate 31 may be a semiconductor wafer, such as, for example, a bulk silicon wafer or a silicon-on-insulator (SOI) wafer. The isolation layer 38 may include, for example, an oxide layer liner 35, a nitride layer liner 36, and an isolation insulating layer 37 which are sequentially stacked (refer to FIG. 3). The oxide layer liner 35 may be, for example, a thermal oxide layer. The nitride layer liner 36 may be a nitride layer, such as, for example, a silicon nitride layer. The isolation insulating layer 37 may be, for example, a silicon oxide layer, such as a high-density plasma (HDP) oxide layer. In another case, the isolation layer 38 may include only the isolation insulating layer 37.

The active region 32 may have, for example, a fin shape. In this case, the isolation insulating layer 37 may be disposed to surround sidewalls of the active region 32. The sidewalls of the active region 32 may be in contact with the oxide layer liner 35. The active region 32 may have various shapes, such as, for example, a trapezoidal shape having a top side with a smaller width than a bottom side or a reverse trapezoidal shape having a top side with a larger width than a bottom side. However, it will be described hereinafter that the active region 32 has a top side with the same width as a bottom side. The active region 32 may have a height of about 250 to about 500 nanometers (nm).

A gate trench 50 may be provided to cross the active region 32 and extend to the isolation layer 38. The gate trench 50 may include an upper trench 45, an intermediate trench 47, and a lower trench 49. Alternatively, the gate trench 50 may include the upper trench 45>an extended intermediate trench 47' and the lower trench 49.

The intermediate trench 47 or the extended intermediate trench 47' may be disposed under the upper trench 45. Also, the extended intermediate trench 47' may have a larger width than the upper trench 45.

The lower trench 49 may be disposed under the intermediate trench 47 or the extended intermediate trench 47'. Also, the lower trench 49 may expose the sidewalls of the active region 32. In other words, the bottom of the lower trench 49 may be at a lower level than the top surface of the adjacent active region 32.

A gate electrode 57' may be disposed to fill a portion of the gate trench 50 and cover at least one of both sidewalls of the active region 32. A gate dielectric layer 55 may be interposed between the gate electrode 57' and the active region 32. An insulating pattern 59 may be disposed on the gate electrode 57'. Source and drain regions 63 may be disposed in the active region 32 on both sides of the gate electrode 57'.

The gate dielectric layer 55 may be disposed to cover an inner wall of the gate trench 50. The gate dielectric layer 55 may include, for example, a silicon oxide layer, a silicon nitride layer, a silicon oxynitride layer, a high-k dielectric layer, or a combination thereof. The gate dielectric layer 55 may be disposed to surround the bottom and sidewalls of the gate electrode 57'. Furthers the gate dielectric layer 55 may also be interposed between the insulating pattern 59 and the source and drain regions 63.

A sidewall spacer 51 may be provided on a portion of the active region 32 exposed by the upper trench 45. In this case, the sidewall spacer 51 may be interposed between the active region 32 and the gate dielectric layer 55. The sidewall spacer 51 may be formed of a material having an etch selectivity with respect to the active region 32 and the isolation layer 38. The sidewall spacer 51 may be formed of, for example, a nitride layer, such as a silicon nitride layer. However, the sidewall spacer 51 may be omitted.

The gate electrode 57' may cover both the sidewalls of the active region 32 exposed by the lower trench 49. In another case, the gate electrode 57' may cover one sidewall of the active region 32 exposed by the lower trench 49. From a plan view, a portion of the gate electrode 57', which passes through the active region 32, may have a larger width than a portion of the gate electrode 57', which extends into the isolation layer 38.

The gate electrode 57' may include, for example, one selected from the group consisting of a polysilicon layer, a metal silicide layer, a metal layer, and a combination thereof.

The insulating pattern 59 may fill the remaining region of the gate trench 50. The top surface of the insulating pattern 59 may be at substantially the same level as the top surface of the active region 32. The insulating pattern 59 may be formed of, for example, a silicon oxide layer.

The gate electrode 57', which is surrounded by the insulating pattern 59 and the active region 32, may constitute a buried gate electrode. Also, the buried gate electrode may extend across the isolation layer 38 to constitute a buried word line.

The source and drain regions 63 may be obtained by implanting high-concentration impurity ions into the active region 32. The top surfaces of the source and drain regions 63 may be at a higher level than the gate electrode 57'.

The effective channel length of the semiconductor device according an exemplary embodiment of the present invention may be controlled by varying the depth of the source and drain regions 63. The bottoms of the source and drain regions 63 may be at a lower level than the bottom of the insulating pattern 59. Alternatively, the bottoms of the source and drain regions 63 may be at the same level as the bottom of the insulating pattern 59.

An interlayer insulating layer 65 may be provided on the entire surface of the semiconductor substrate 31 having the source and drain regions 63 and the insulating pattern 59. The interlayer insulating layer 65 may be, for example, a silicon oxide layer, a silicon nitride layer, a silicon oxynitride layer, a low-k dielectric layer, or a combination thereof. A bit plug 67 and a bit line 69 may be disposed in the interlayer insulating layer 65. The bit plug 67 may be in contact with one of the source and drain regions 63 and the bit line 69. The bit plug 67 and the bit line 69 may be formed of a conductive material layer. For example, the conductive material layer may include a metal layer and a barrier metal layer surrounding the metal layer.

A storage plug 71 may be disposed through the interlayer insulating layer 65 and come into contact with the other of the source and drain regions 63. The storage plug 71 may be formed of, for example, a polysilicon layer. Also, the storage plug 71 may be formed of a conductive material layer. For example, the conductive material layer may include a metal layer and a barrier metal layer surrounding the metal layer.

A storage capacitor 75 may be disposed on the interlayer insulating layer 65 and come into contact with the storage plug 71. The storage capacitor 75 may be electrically connected to the source and drain regions 63 through the storage plug 71.

As shown in FIG. 11, the effective channel length of the semiconductor device according to an exemplary embodiment of the present invention may be defined as $L1+L2+L3$. On the other hand, the effective channel length of a conventional planar transistor may be smaller than $L2$. In other words, the effective channel length of a semiconductor device according to an exemplary embodiment of the present invention may be significantly larger than that of the conventional planar transistor.

Further on the basis of a lower region of the gate trench 50, the effective channel width of the semiconductor device according to an exemplary embodiment of the present invention may be defined as $W1+W2+W3$. On the other hand, the effective channel width of the conventional planar transistor or a conventional recess-channel transistor may be defined as $W1$. Therefore, the effective channel width of the semiconductor device according to an exemplary embodiment of the present invention may be larger than that of the conventional transistors.

As is well known, the conventional recess-channel transistor is structurally vulnerable to a body effect. In contrast, the semiconductor device according to an exemplary embodiment of the present invention may include the gate electrode 57', which fills a portion of the gate trench 50 and covers at least one of both sidewalls of the active region 32. In this case, a portion of the gate electrode 57', which covers the sidewall (s) of the active region 32, may extend under a portion of the gate electrode 57', which crosses the active region 32. Thus, the semiconductor device according to an exemplary embodiment of the present invention can effectively diminish the difficulties caused by body effect.

The semiconductor device according to an exemplary embodiment of the present invention can have a larger effective channel width and effective channel length than conventional transistors and can significantly diminish the difficulties caused by body effect.

Figure 18:
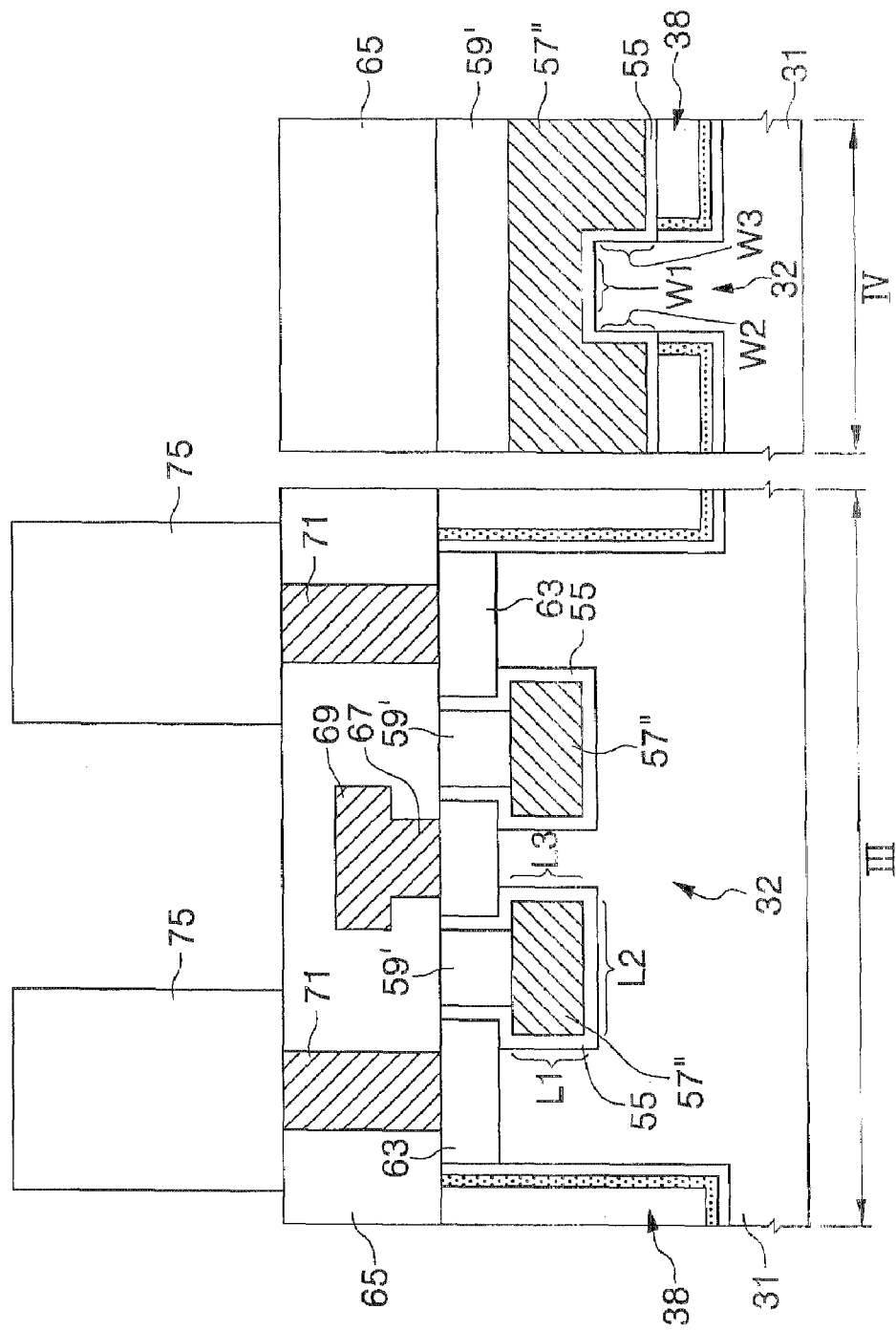

A DRAM having a buried gate electrode according to another exemplary embodiment of the present invention will now be described with reference to FIGS. 12, 13, and 18. In FIG. 18, a region "III" is a cross-sectional view taken along line III-III' of FIG. 12, and a region "IV" is a cross-sectional view taken along line IV-IV' of FIG. 12.

Figure 12:
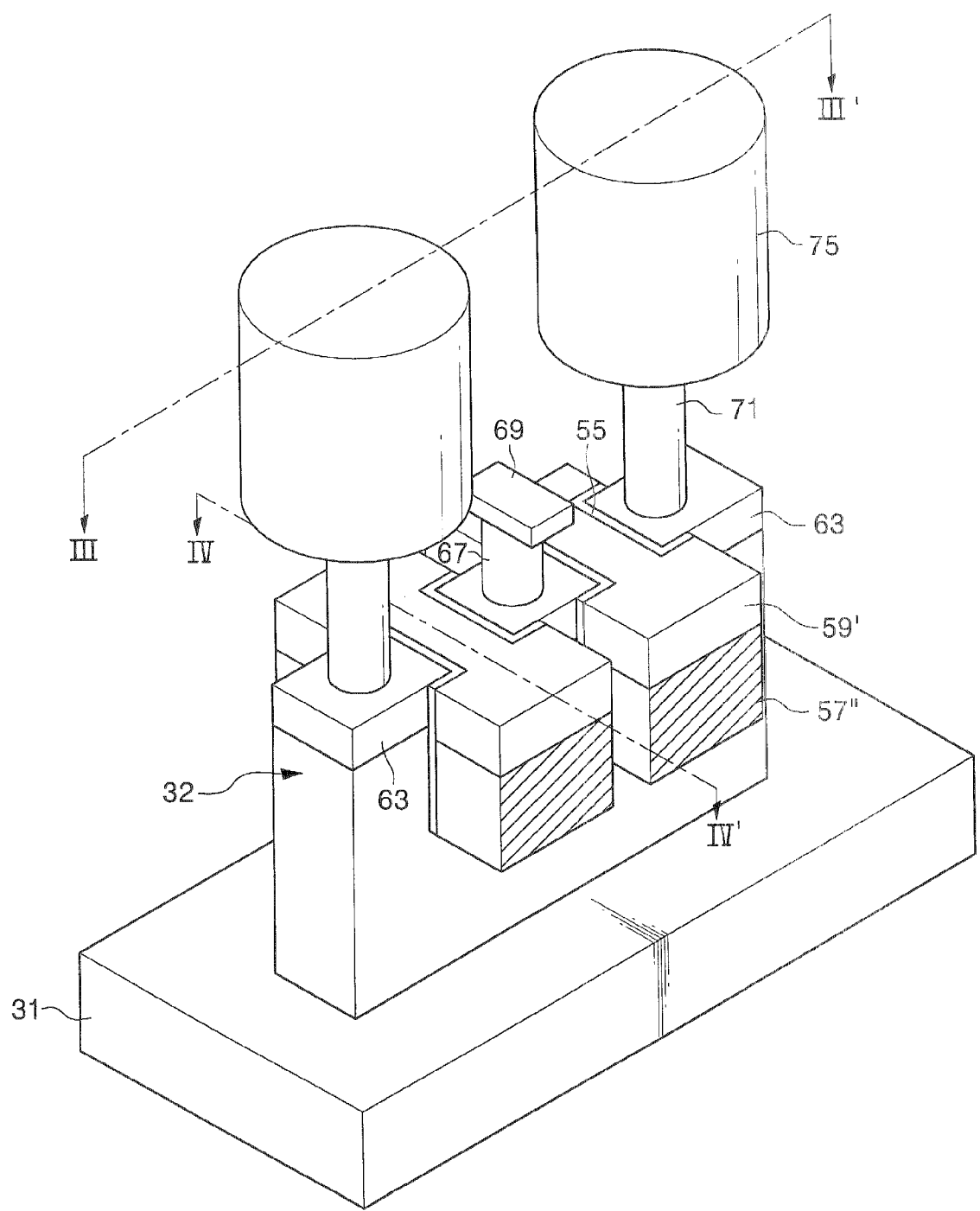
FIG. 12 is a perspective view of a portion of a DRAM having a buried gate electrode according to an exemplary embodiment of the present invention.
Figure 13:
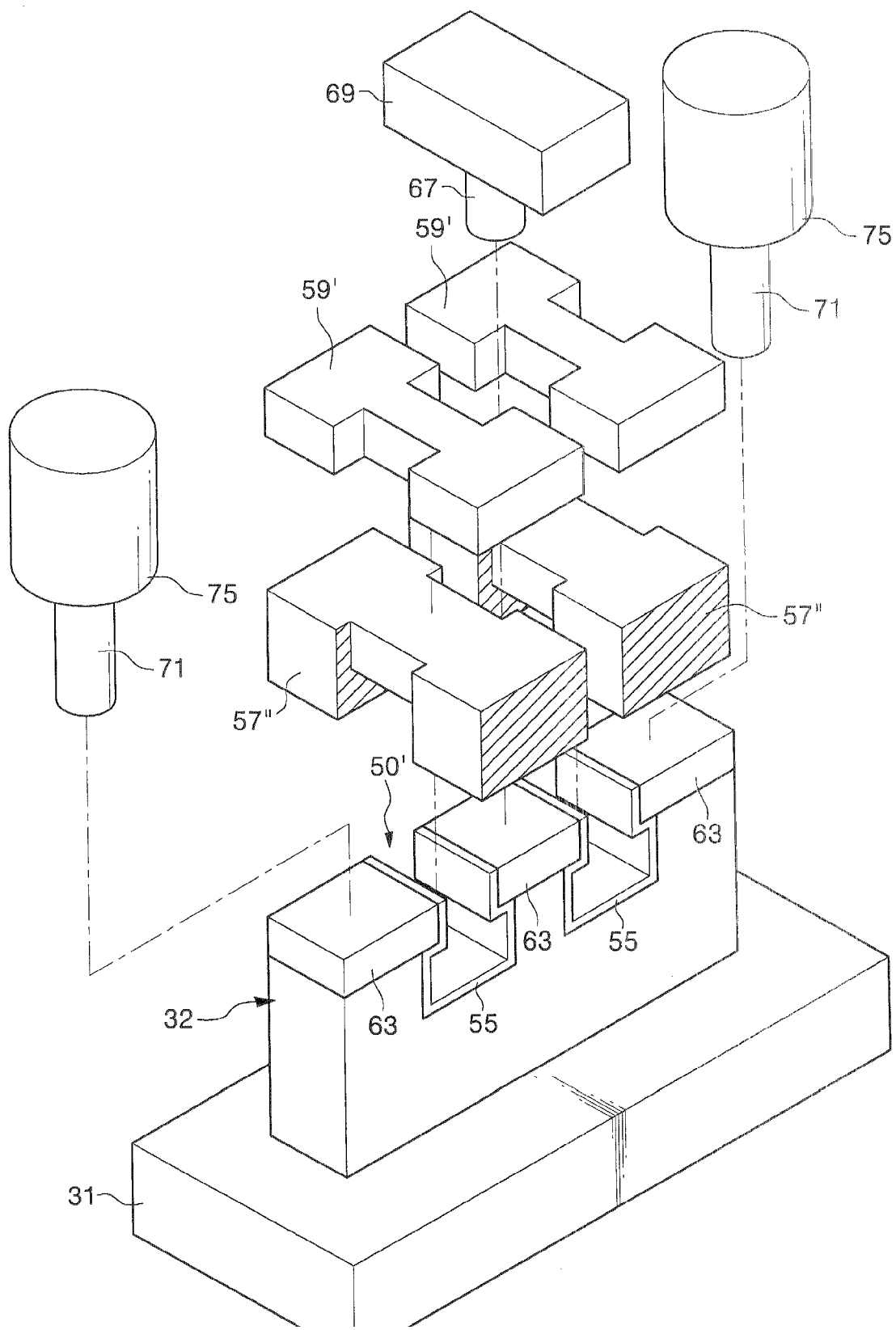
FIG. 13 is an exploded perspective view of the portion of the DRAM shown in FIG. 12.

Referring to FIGS. 12, 13, and 18, an isolation layer 38 is provided in a semiconductor substrate 31 to define an active region 32. Hereinafter, only differences between the DRAM having the buried gate electrode according to the exemplary embodiment of the present invention described with reference to FIG. 1 and the DRAM having the buried gate electrode according to the present exemplary embodiment will be briefly described.

The semiconductor substrate 31 may be a semiconductor wafer. The isolation layer 38 may include, for example, an oxide layer liner 35, a nitride layer liner 36, and an isolation insulating layer 37 which are sequentially stacked. In another case, the isolation layer 38 may include only the isolation insulating layer 37.

The active region 32 may have for example, a fin shape. In this case, the isolation insulating layer 37 may be disposed to surround sidewalls of the active region 32. The sidewalls of the active region 32 may be in contact with the oxide layer liner 35.

A gate trench 50' may be provided to cross the active region 32 and extend to the isolation layer 38. The gate trench 50' may include an upper trench 45, an intermediate trench 47, and a lower trench 46. Alternatively, the gate trench 50' may include the upper trench 45, an extended intermediate trench 47', and an extended lower trench 46'.

The intermediate trench 47 or the extended intermediate trench 47' may be disposed under the upper trench 45. Also, the extended intermediate trench 47' may have a larger width than the upper trench 45.

The lower trench 46 and the extended lower trench 46' may be disposed under the intermediate trench 47 or the extended intermediate trench 47'. Also, the lower trench 46 and the extended lower trench 46' may expose the sidewalls of the active region 32. In other words, bottoms of the lower trench 46 and the extended lower trench 46' may be at a lower level than the top surface of the adjacent active region 32.

A gate electrode 57" may be disposed to fill a portion of the gate trench 50' and cover at least one of both sidewalls of the active region 32. A gate dielectric layer 55 may be interposed between the gate electrode 57" and the active region 32. An insulating pattern 59' may be disposed on the gate electrode 57". Source and drain regions 63 may be disposed in the active region 32 on both sides of the gate electrode 57".

The gate dielectric layer 55 may be disposed to cover an inner wall of the gate trench 50'. The gate dielectric layer 55 may include, for example, a silicon oxide layer, a silicon nitride layer, a silicon oxynitride layers a high-k dielectric layer, or a combination thereof. The gate dielectric layer 55 may be disposed to surround the bottom and sidewalls of the gate electrode 57". Further, the gate dielectric layer 55 may also be interposed between the insulating pattern 59' and the source and drain regions 63.

A sidewall spacer may be provided on a portion of the active region 32 exposed by the upper trench 45. However, the sidewall spacer may be omitted.

The gate electrode 57" may cover both the sidewalls of the active region 32 exposed by the lower trench 46 or the extended lower trench 46' In another case, the gate electrode 57" may cover one sidewall of the active region 32 exposed by the lower trench 46 or the extended lower trench 46'. From a plan view a portion of the gate electrode 57", which passes through the active region 32, may have a smaller width than a portion of the gate electrode 57", which extends into the isolation layer 38. Further, the portion of the gate electrode 57", which extends into the isolation layer 38, may be thicker than the portion of the gate electrode 57", which passes through the active region 32.

The gate electrode 57" may include, for example, one selected from the group consisting of a polysilicon layer, a metal silicide layer, a metal layer, and a combination thereof.

The insulating pattern 59' may fill the remaining region of the gate trench 50'. The top surface of the insulating pattern 59' may be at substantially the same level as the top surface of the active region 32. The insulating pattern 59' may be formed of, for example, a silicon oxide layer.

The gate electrode 57", which is surrounded by the insulating pattern 59' and the active region 32, may constitute a buried gate electrode. Also, the buried gate electrode may extend across the isolation layer 38 and constitute a buried word line.

The source and drain regions 63 may be obtained by implanting high-concentration impurity ions into the active region 32. The top surfaces of the source and drain regions 63 may be at a higher level than the gate electrode 57".

The effective channel length of the semiconductor device according to another exemplary embodiment of the present invention may be controlled by varying the depth of the source and drain regions 63. The bottoms of the source and drain regions 63 may be lower than the bottom of the insulating pattern 59'. Alternatively, the bottoms of the source and drain regions 63 may be at the same level as the bottom of the insulating pattern 59'.

An interlayer insulating layer 65 may be provided on the entire surface of the semiconductor substrate 31 having the source and drain regions 63 and the insulating pattern 59'. The interlayer insulating layer 65 may be, for example, a silicon oxide layer, a silicon nitride layer, a silicon oxynitride layer, a low-k dielectric layer, or a combination thereof. A bit plug 67 and a bit line 69 may be disposed in the interlayer insulating layer 65. The bit plug 67 may be in contact with one of the source and drain regions 63 and the bit line 69. The bit plug 67 and the bit line 69 may be formed of a conductive material layer.

A storage plug 71 may be disposed through the interlayer insulating layer 65 and come into contact with the other of the source and drain regions 63. The storage plug 71 may be formed of a conductive material layer.

A storage capacitor 75 may be disposed on the interlayer insulating layer 65 and come into contact with the storage plug 71. The storage capacitor 75 may be electrically connected to the source and drain regions 63 through the storage plug 71.

As shown in FIG. 18, the effective channel length of the semiconductor device according to another exemplary embodiment of the present invention may be defined as L1+L2+L3. On the other hand, the effective channel length of a conventional planar transistor may be smaller than L2. In other words, the effective channel length of the semiconductor device according to the present exemplary embodiment of the present invention may be significantly larger than that of the conventional planar transistor.

Further, on the basis of a lower region of the gate trench 50', the effective channel width of the semiconductor device according to the present exemplary embodiment of the present invention may be defined as W1+W2+W3. On the other hand, the effective channel width of the conventional planar transistor or a conventional recess-channel transistor may be defined as W1. Therefore, the effective channel width of the semiconductor device according to the present exemplary embodiment of the present invention may be larger than those of the conventional transistors.

As is well known, the conventional recess-channel transistor is structurally vulnerable to a body effect. In contrast, the semiconductor device according to the present embodiment of the present invention may include the gate electrode 57", which fills a portion of the gate trench 50' and covers at least one of both sidewalls of the active region 32. In this case, a portion of the gate electrode 57", which covers the sidewall(s) of the active region 32, may extend under a portion of the gate electrode 57", which crosses the active region 32. Thus, the semiconductor device according to the present exemplary embodiment of the present invention can effectively diminish the difficulties caused by body effect.

The semiconductor device according to the present exemplary embodiment of the present invention can have a larger effective channel width and effective channel length than conventional transistors, and can significantly diminish the difficulties caused by body effect.

A method of fabricating a DRAM having a buried gate electrode according to an exemplary embodiment of the present invention will now be described with reference to FIGS. 1 through 11. In FIGS. 3 through 11, a region "I" is a cross-sectional view taken along line I-I' of FIG. 1, and a region "II" is a cross-sectional view taken along line II-II' of FIG. 1.

Figure 3:
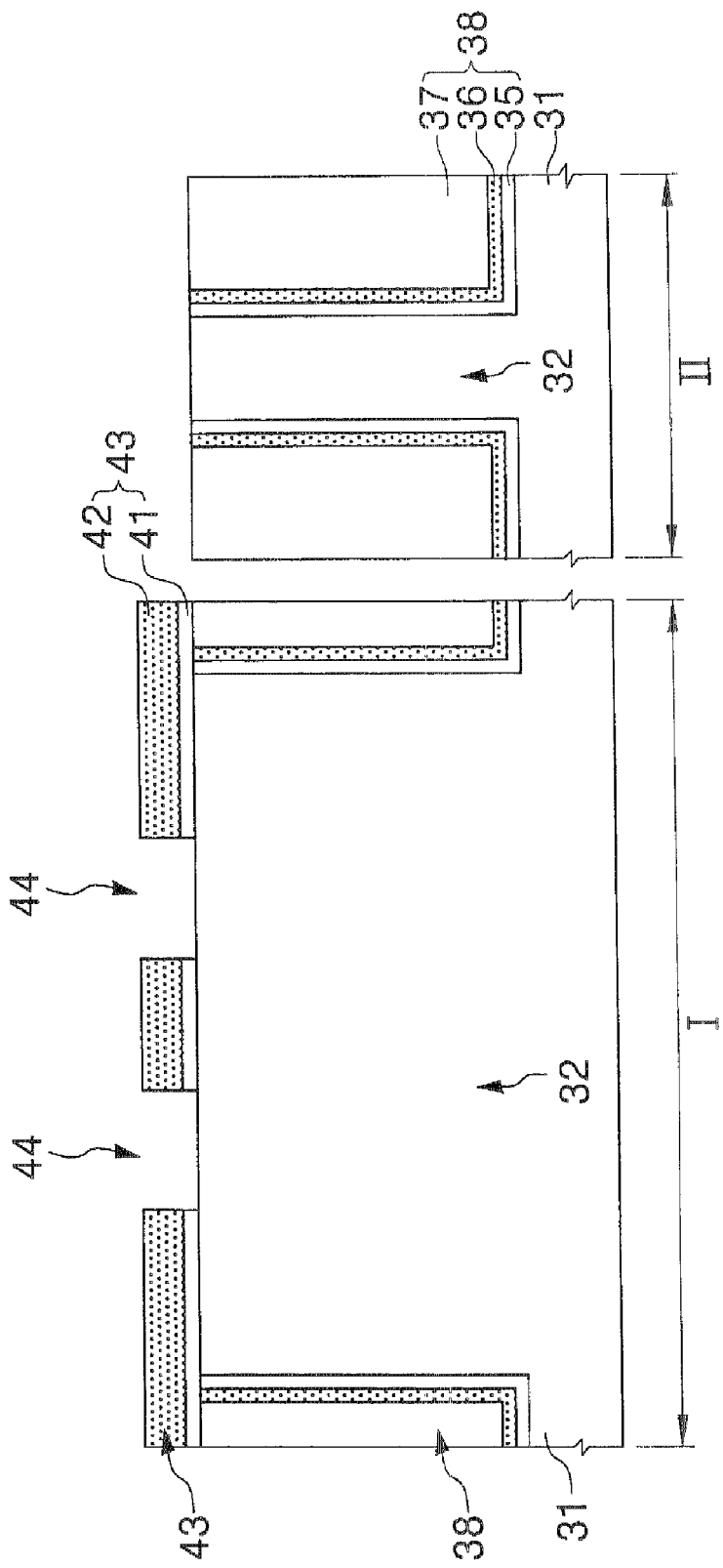
FIGS. 3 through 11 are cross-sectional views illustrating a method of fabricating a DRAM having a buried gate electrode according to an exemplary embodiment of the present invention.

Referring to FIGS. 1, 2, and 3, an isolation layer 38 is formed in a semiconductor substrate 31 to define an active region 32.

The semiconductor substrate 31 may be a semiconductor wafer, such as, for example, a bulk silicon wafer or an SOI wafer. For brevity of explanation, the semiconductor substrate 31 will be described as a bulk silicon wafer.

The isolation layer 38 may be obtained using a known trench isolation technique. The isolation layer 38 may be formed by sequentially stacking an oxide layer liner 35, a nitride layer liner 36, and an isolation insulating layer 37. The oxide layer liner 35 may be formed of, for example, a thermal oxide layer. The nitride layer liner 36 may be formed of a nitride layer, such as, for example, a silicon nitride layer. The isolation insulating layer 37 may be formed of, for example, a silicon oxide layer, such as a high density plasma (HDP) oxide layer. In another case, the isolation layer 38 may be formed of only the isolation insulating layer 37.

The active region 32 may be formed in, for example, a fin shape. In this case, the isolation insulating layer 37 may be formed to surround sidewalls of the active region 32. The sidewalls of the active region 32 may be in contact with the oxide layer liner 35. The active region 32 may have various shapes, such as, for example, a trapezoidal shape having a top side with a smaller width than a bottom side or a reverse trapezoidal shape having a top side with a larger width than a bottom side. However, in this exemplary embodiment, the active region 32 has a top side with the same width as a bottom side.

A mask pattern 43 may be formed on the semiconductor substrate 31 having the isolation layer 38. The mask pattern 43 may be formed by sequentially stacking a buffer layer 41 and a hard mask layer 42. The buffer layer 41 may be formed of, for example, a silicon oxide layer by means of a thermal oxidation process or a chemical vapor deposition (CVD) process. The hard mask layer 42 may be formed of a material having an etch selectivity with respect to the isolation layer 38. The hard mask layer 42 may be formed of a nitride layer, such as, for example, a silicon nitride layer.

The mask pattern 43 may include an opening 44 exposing a top surface of the active region 32 and a top surface of the isolation layer 38. The opening 44 may cross over the active region 32 and extend onto the isolation layer 38. Further, two or more openings 44 may be formed in a row in the mask pattern 43.

Figure 4:
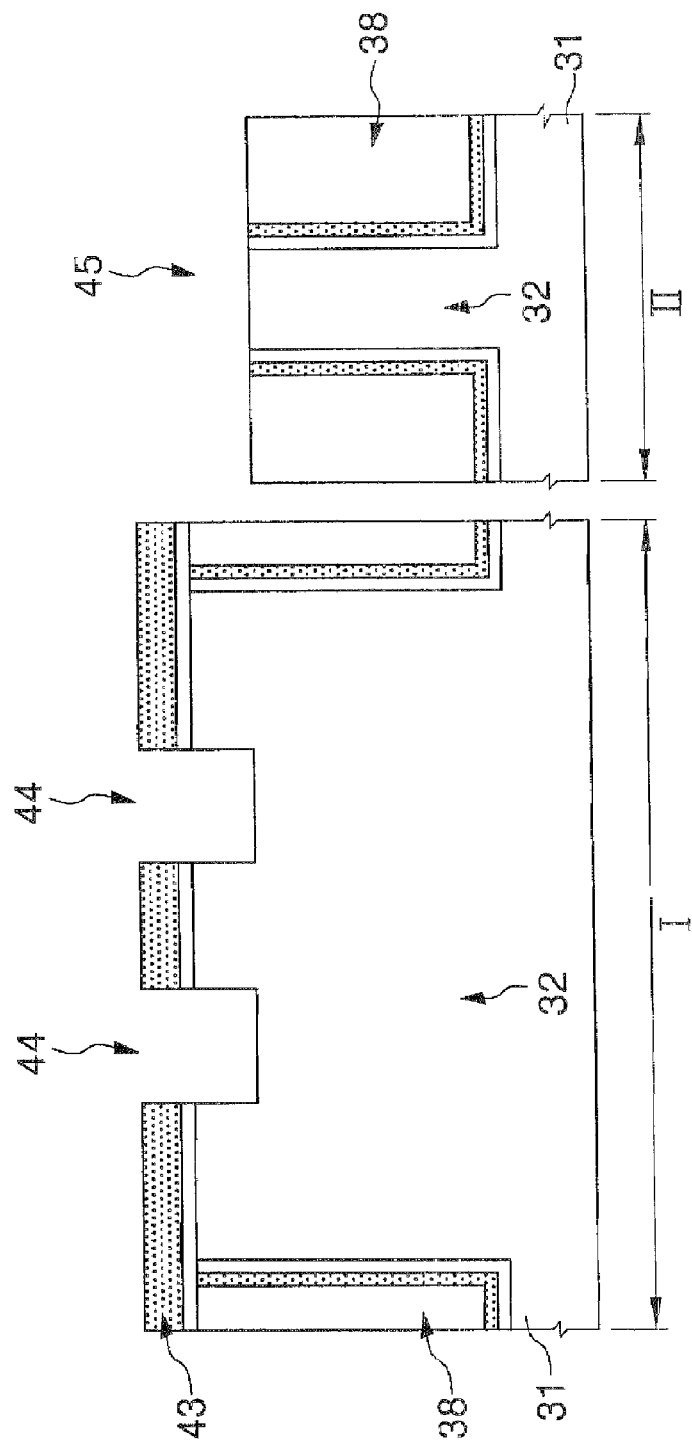

Referring to FIGS. 1, 2, and 4, the active region 32 and the isolation layer 38 may be etched using the mask pattern 43 as an etch mask, thereby forming an upper trench 45.

The upper trench 45 may be formed by use of an anisotropic etching process having a high etch rate with respect to the active region 32 and the isolation layer 38. Alternatively, to form the upper trench 45, a primary etching process may be performed by use of a first anisotropic etching process having a high etch rate with respect to one of the active region 32 and the isolation layer 38, and a secondary etching process may be performed by use of a second anisotropic etching process having a high etch rate with respect to the other of the active region 32 and the isolation layer 38. Alternatively, the upper trench 45 may be obtained by repeatedly performing the first and second anisotropic etching processes.

As a result, the upper trench 45 may be formed across the active region 32 and the isolation layer 38. The active region 32 and the isolation layer 38 may be exposed by the upper trench 45. Also, the active region 32 and the isolation layer 38, which are exposed by the upper trench 45, may be at substantially the same level.

Figure 5:
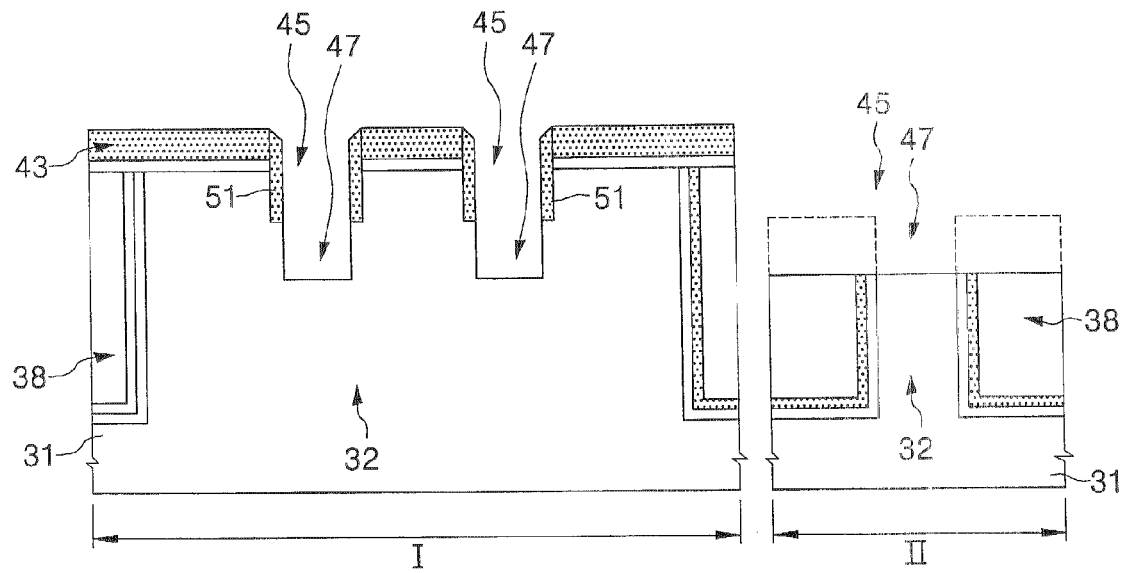

Referring to FIGS. 1, 2, and 5, sidewall spacers 51 may be formed on sidewalls of the upper trench 45. The sidewall spacer 51 may be formed of a material having an etch selectivity with respect to the active region 32 and the isolation layer 38. The sidewall spacer 51 may be formed of, for example, a nitride layer, such as a silicon nitride layer.

For example, a spacer layer may be formed on the entire surface of the semiconductor substrate 31 having the upper trench 45. In this case, the inner walls of the upper trench 45 are covered by the spacer layer. The spacer layer may be anisotropically etched until the active region 32 and the isolation layer 38 are exposed by the upper trench 45. As a result, the sidewall spacers 51 are disposed on the sidewalls of the upper trench 45.

Subsequently, the active region 32 and the isolation layer 38, which are exposed by the bottom of the upper trench 45, are etched to form an intermediate trench 47. The intermediate trench 47 may be formed by an anisotropic etching process having a high etch rate with respect to the active region 32 and the isolation layer 38. Alternatively, to form the intermediate trench 47, a primary etching process may be performed by use of a first anisotropic etching process having a high etch rate with respect to one of the active region 32 and the isolation layer 38, and a secondary etching process may be performed by use of a second anisotropic etching process having a high etch rate with respect to the other of the active region 32 and the isolation layer 38. Alternatively, the intermediate trench 47 may be obtained by repeatedly performing the first and second anisotropic etching processes.

As a result, the intermediate trench 47 may be formed across the active region 32 and the isolation layer 38. The active region 32 and the isolation layer 38 may be exposed by inner walls of the intermediate trench 47.

Furthermore, the intermediate trench 47 may be formed by an anisotropic etching process having a high etch rate with respect to the active region 32.

Figure 6:
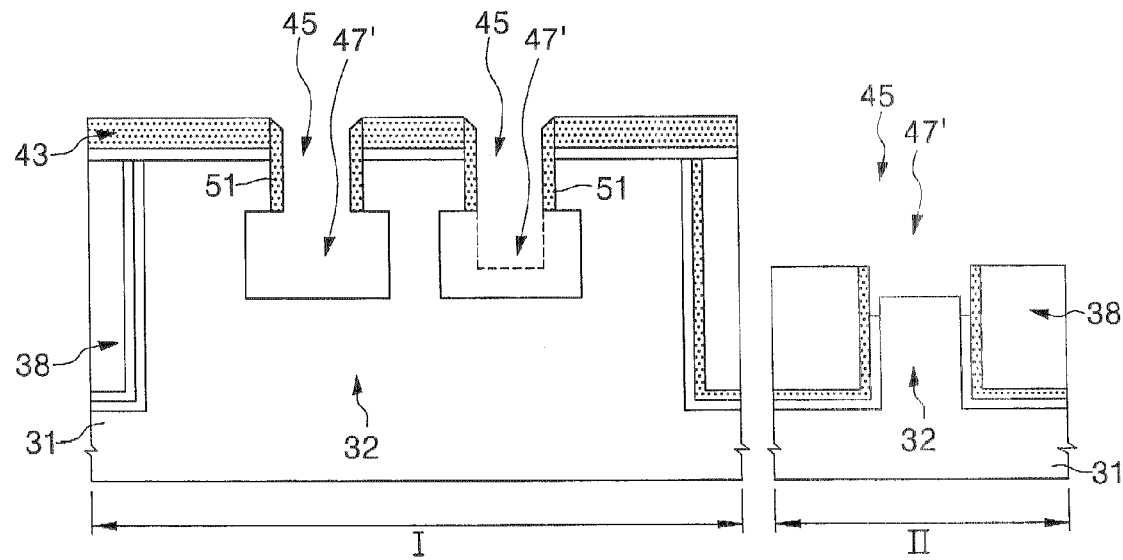

Referring to FIGS. 1, 2, and 6, an isotropic etching process may be performed on the semiconductor substrate 31 having the intermediate trench 47, thereby forming an extended intermediate trench 47'.

The extended intermediate trench 47' may be formed by an isotropic etching process having a high etch rate with respect to the active region 32. In this case, the sidewall spacers 51 may function as an etch stop layer for preventing extension of the upper trench 45. Thus, the extended intermediate trench 47' may be formed to a larger width than the upper trench 45.

In another case, the extended intermediate trench 47' may be formed by repeatedly performing an isotropic etching process having a high etch rate with respect to the oxide layer liner 35 or the nitride layer liner 36 and an isotropic etching process having a high etch rate with respect to the active region 32.

Figure 7:
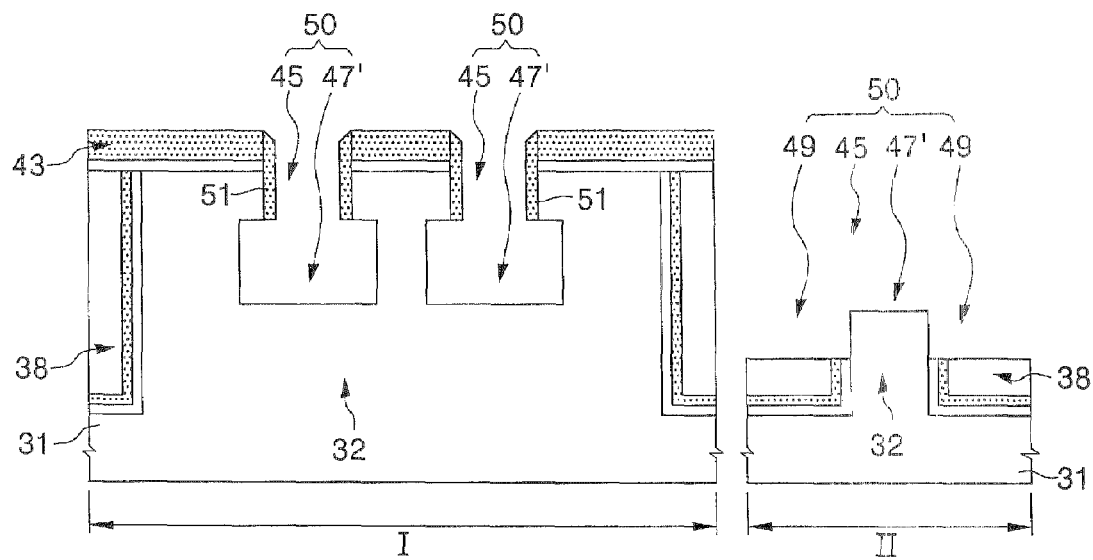

Referring to FIGS. 1, 2, and 7, the isolation layer 38, which is exposed by the extended intermediate trench 47', may be etched to form a lower trench 49. The upper trench 45, the extended intermediate trench 474, and the lower trench 49 may constitute a gate trench 50.

The lower trench 49 may be formed by an anisotropic etching process having a high etch rate with respect to the isolation layer 38. The isolation layer 38 may remain on the bottom of the lower trench 49. Also, the lower trench 49 may partially expose the sidewalls of the active region 32.

As a consequence, the gate trench 50 may be formed across the active region 32, have a larger bottom width than a top width, and partially expose the sidewalls of the active region 32.

Channel ions may be implanted into the active region 32 having the gate trench 50. The implantation of the channel ions may be performed using a plasma doping process.

Figure 8:
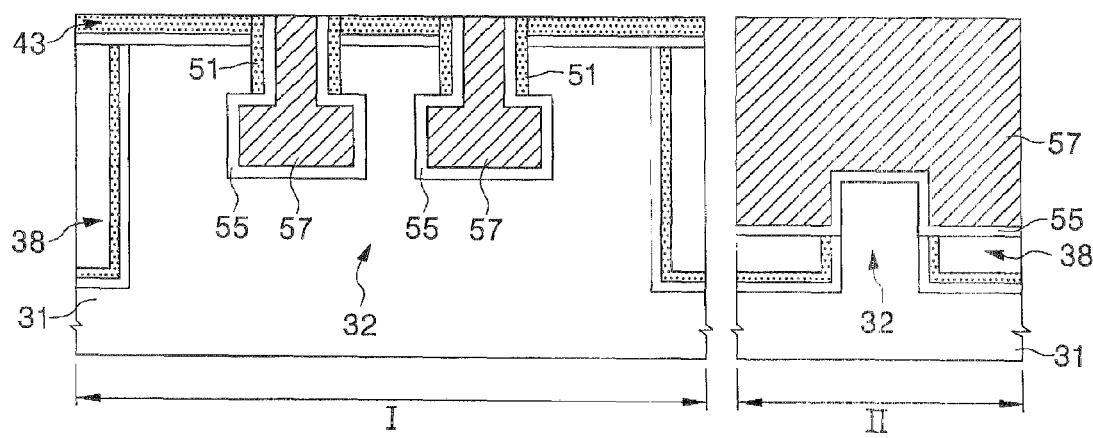

Referring to FIGS. 1, 2, and 8, a gate dielectric layer 55 may be formed on an inner wall of the gate trench 50. Subsequently, a preliminary gate electrode 57 may be formed to fill the gate trench 50.

For example, the gate dielectric layer 55 may be formed by a thermal oxidation process, a CVD process, or an atomic layer deposition (ALD) process. The gate dielectric layer 55 may be formed of, for example, a silicon oxide layers a silicon nitride layer, a silicon oxynitride layer, a high-k dielectric layer, or a combination thereof. The preliminary gate electrode 57 may be obtained by forming a gate conductive layer to fill the gate trench 50 and cover the semiconductor substrate 31 and planarizing the gate conductive layer until the mask pattern 43 is exposed. The planarization of the gate conductive layer may be performed by means of a chemical mechanical polishing (CMP) process or an etch-back process.

The gate conductive layer may be formed of, for example, one selected from the group consisting of a polysilicon layer, a metal silicide layer, a metal layer, and a combination thereof.

Figure 9:
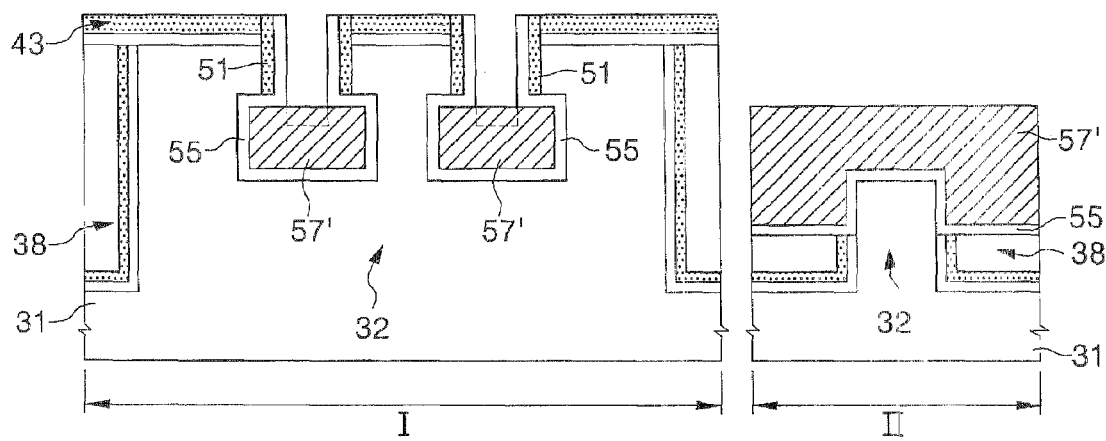

Referring to FIGS. 1, 2, and 9, the preliminary gate electrode 57 may be etched back to form a gate electrode 57'. Thus, the gate electrode 57' may be formed to fill a lower region of the gate trench 50.

The gate electrode 57' may be formed to fill the extended intermediate trench 47' and the lower trench 49. In other words, the gate electrode 57' may be formed across the active region 32 and partially cover the sidewalls of the active region 32.

The etching back of the preliminary gate electrode 57 may be performed using an anisotropic etching process. In other words, the gate electrode 57' may be obtained by anisotropically etching the preliminary gate electrode 57.

In this case, even if the extended intermediate trench 47' is partially exposed by over-etching the preliminary gate electrode 57, the gate electrode 57' may remain on sidewalls of the extended intermediate trench 47'. Thus, there is a sufficient process margin in the process of forming the gate electrode 57'.

Figure 10:
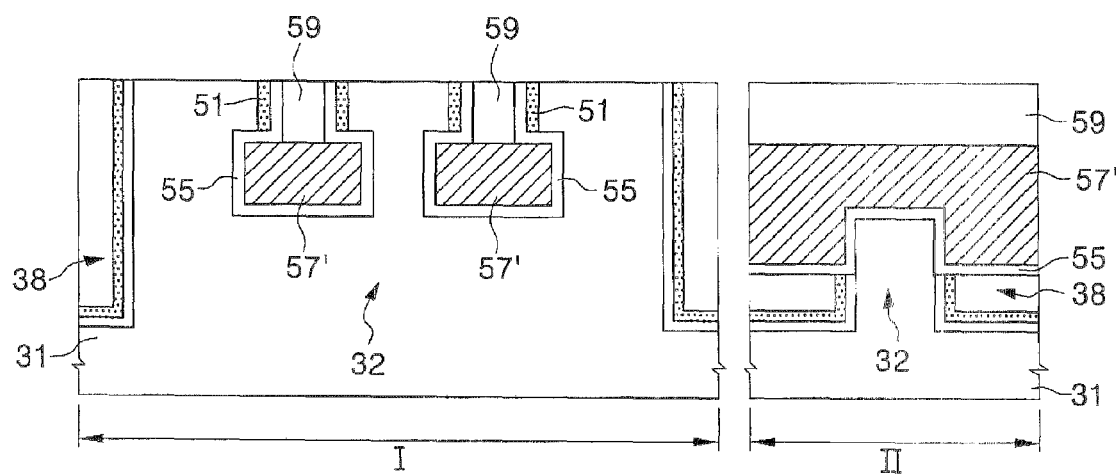

Referring to FIGS. 1, 2, and 10, an insulating pattern 59 may be formed to fill the remaining region of the gate trench 50.

For example, an insulating layer may be formed on the entire surface of the semiconductor substrate 31 and planarized to form the insulating pattern 59. The planarization of the insulating layer may be performed by use of a CMP process until the top surface of the active region 32 is exposed. The insulating pattern 59 may be formed to cover the gate electrode 57'. The insulating pattern 59 may be formed of, for example, a silicon oxide layer.

The gate electrode 57', which is covered by the insulating pattern 59, may constitute a buried gate electrode. Also, the buried gate electrode may extend across the isolation layer 38 and constitute a buried word line.

Referring to FIGS. 1, 2, and 11, impurity ions may be heavily doped into the exposed active region 32, thereby forming source and drain regions 63.

The effective channel length of the semiconductor device according to an exemplary embodiment of the present invention may be controlled by varying the depth of the source and drain regions 63. The bottoms of the source and drain regions 63 may be lower than the bottom of the insulating pattern 59. Alternatively, the bottoms of the source and drain regions 63 may be at substantially the same level as the bottom of the insulating pattern 59.

An interlayer insulating layer 65 may be formed on the entire surface of the semiconductor substrate 31. The interlayer insulating layer 65 may be formed of, for example, a silicon oxide layer, a silicon nitride layer, a silicon oxynitride layer, a low-k dielectric layer, or a combination thereof. A bit plug 67 and a bit line 69 may be formed in the interlayer insulating layer 65.

The bit plug 67 and the bit line 69 may be formed of a conductive material layer. For example, the conductive material layer may be formed of a metal layer and a barrier metal layer surrounding the metal layer. The bit plug 67 may be in contact with one of the source and drain regions 63 and the bit line 69.

A storage plug 71 may be formed through the interlayer insulating layer 65 and brought into contact with the other of the source and drain regions 63. The storage plug 71 may be formed of a conductive material layer. For example, the storage plug 71 may be formed of a polysilicon layer. In another method the storage plug 71 may be formed of a metal layer and a barrier metal layer surrounding the metal layer.

A storage capacitor 75 contacting the storage plug 71 may be formed on the interlayer insulating layer 65. The storage capacitor 75 may be electrically connected to the source and drain regions 63 through the storage plug 71.

The effective channel length of the semiconductor device according to an exemplary embodiment of the present invention can be defined as L1+L2+L3. Here L1 and L2 may be controlled by varying the depth of the source and drain regions 63. Thus, there is a sufficient process margin in the process of forming the gate electrode 57'.

A method of fabricating a DRAM having a buried gate electrode according to another exemplary embodiment of the present invention will now be described with reference to FIGS. 12 through 18. In FIGS. 14 through 18, a region "III" is a cross-sectional view taken along line III-III' of FIG. 12, and a region "IV" is a cross-sectional view taken along line IV-IV' of FIG. 12.

Figure 14:
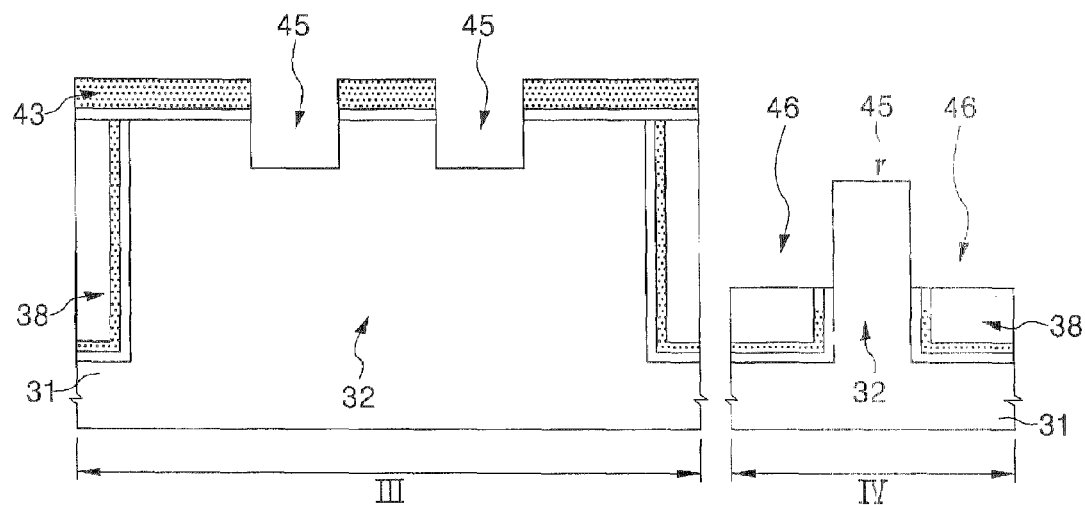
FIGS. 14 through 18 are cross-sectional views illustrating a method of fabricating a DRAM having a buried gate electrode according to an exemplary embodiment of the present invention.

Referring to FIGS. 12, 13, and 14, an isolation layer 38 is formed on a semiconductor substrate 31 to define an active region 32, A mask pattern 43 may be formed in the same manner as described with reference to FIG. 3. Hereinafter, only differences between the present exemplary embodiment and the previous exemplary embodiment will be briefly described.

The active region 32 and the isolation layer 38 may be etched using the mask pattern 43 as an etch mask, thereby sequentially forming an upper trench 45 and a lower trench 46. The upper trench 45 may be formed by use of an anisotropic etching process having a high etch rate with respect to the active it region 32 and the isolation layer 38. The lower trench 46 may be formed by use of an anisotropic etching process having a high etch rate with respect to the isolation layer 38.

As a result, sidewalls of the active region 32 may be partially exposed by the lower trench 46.

Figure 15:
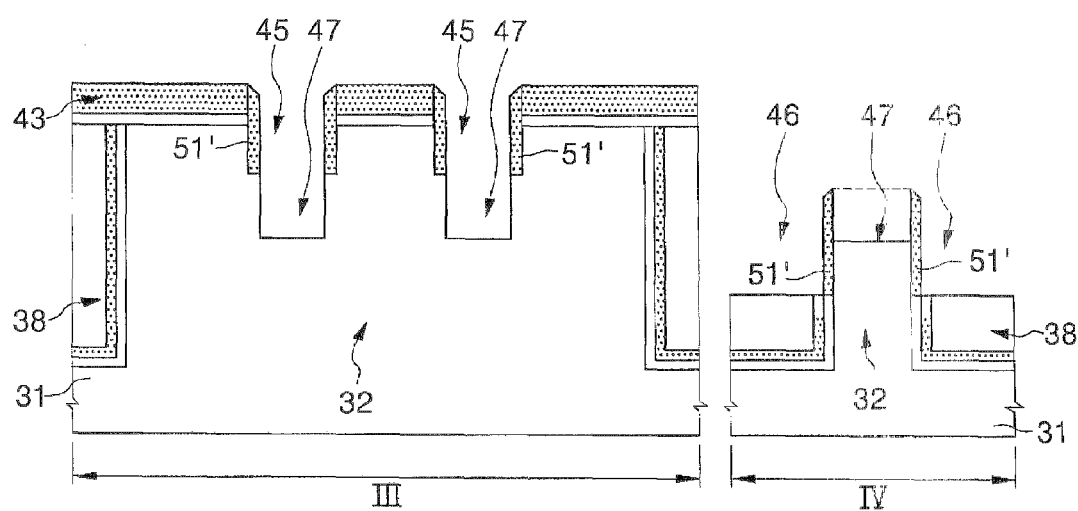

Referring to FIGS. 12, 13, and 15, sidewall spacers 51' may be formed on sidewalls of the upper and lower trenches 45 and 46. The sidewall spacer 51' may be formed of a material having an etch selectivity with respect to the active region 32 and the isolation layer 38. The sidewall spacer 51' may be formed of, for example, a nitride layer, such as a silicon nitride layer. In this case, the sidewall spacer 51' may be formed also on the sidewalls of the active region 32 exposed by the lower trench 46.

Subsequently, the active region 32 exposed by the upper trench 45 may be etched to form an intermediate trench 47. The intermediate trench 47 may be formed by use of an anisotropic etching process having a high etch rate with respect to the active region 32.

Figure 16:
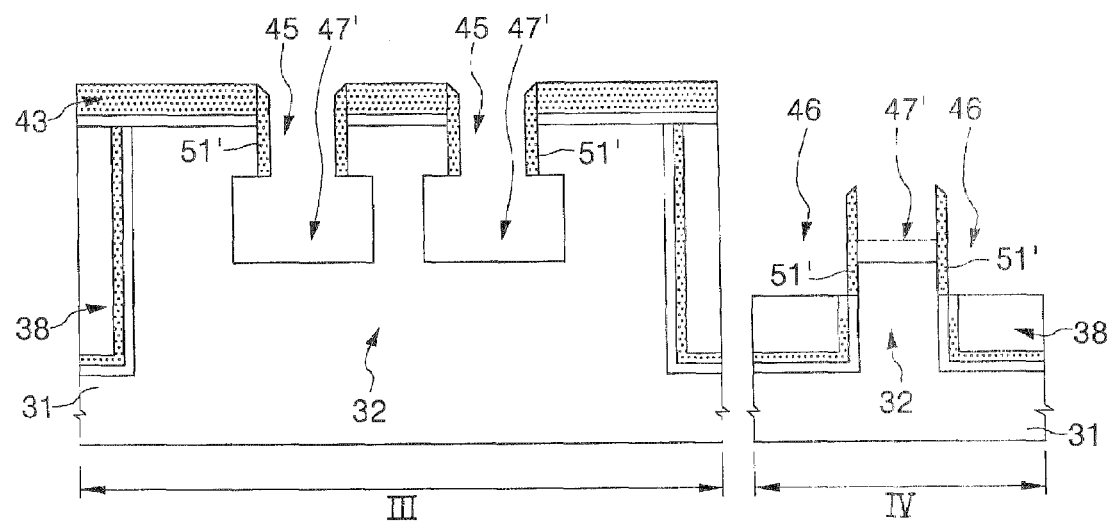

Referring to FIGS. 12, 13, and 16, an isotropic etching process may be performed on the semiconductor substrate 31 having the intermediate trench 47 to form an extended intermediate trench 47'.

The extended intermediate trench 47' may be formed by an isotropic etching process having a high etch rate with respect to the active region 32. In this case, the sidewall spacers 51' may function as an etch stop layer for preventing extension of the upper and lower trenches 45 and 46. As a result, the extended intermediate trench 47' may be formed to a larger width than the upper trench 45.

Figure 17:
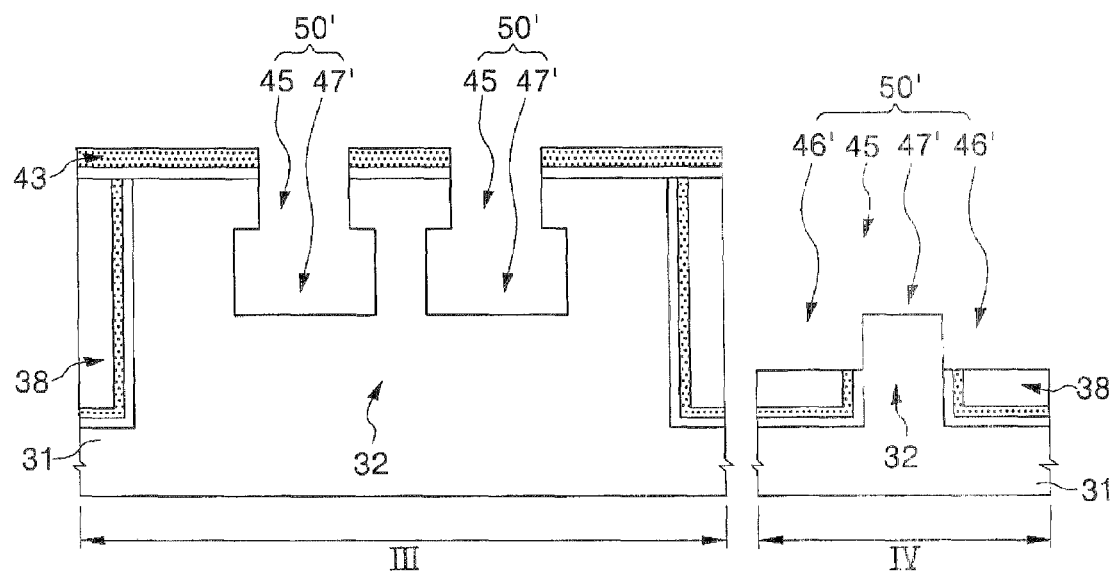

Referring to FIGS. 12, 13, and 17, the sidewall spacers 51' may be removed, and an extended lower trench 46' may be formed by an isotropic etching process. The upper trench 45, the extended intermediate trench 47', and the extended lower trench 46' may constitute a gate trench 50'.

The extended lower trench 46' may be formed by an isotropic etching process having a high etch rate with respect to the isolation layer 38. During this isotropic etching process, the upper trench 45 and the extended intermediate trench 47' also may be partially etched and further extend. However, the process of forming the extended lower trench 46' may be omitted.

Referring to FIGS. 12, 13, and 18, channel ions may be implanted into the active region 32 having the gate trench 50'. The channel ions may be implanted using a plasma doping process.

A gate dielectric layer 55 may be formed on an inner wall of the gate trench 50'. Subsequently, a gate electrode 57" may be formed to fill a lower region of the gate trench 50'. The gate electrode 57" may be formed to fill the extended intermediate trench 47' and the extended lower trench 46'. In other words, the gate electrode 57" may be formed to cross the active region 32 and partially cover the sidewalls of the active region 32.

An insulating pattern 59' may be formed to fill the remaining region of the gate trench 50' Impurity ions may be heavily doped into the exposed active region 32, thereby forming source and drain regions 63.

The effective channel length of the semiconductor device according to exemplary embodiments of the present invention may be controlled by varying the depth of the source and drain regions 63. The bottoms of the source and drain regions 63 may be at a lower level than the bottom of the insulating pattern 59'. Alternatively, the bottoms of the source and drain regions 63 may be at substantially the same level as the bottom of the insulating pattern 59'.

An interlayer insulating layer 65 may be formed on the entire surface of the semiconductor substrate 31. A bit plug 67 and a bit line 69 may be formed in the interlayer insulating layer 65. The bit plug 67 may be in contact with one of the source and drain regions 63 and the bit line 69.

A storage plug 71 may be formed through the interlayer insulating layer 65 and brought into contact with the other of the source and drain regions 63. A storage capacitor 75 contacting the storage plug 71 may be formed on the interlayer insulating layer 65. The storage capacitor 75 may be electrically connected to the source and drain regions 63 through the storage plug 71.

The effective channel length of the semiconductor device according to exemplary embodiments of the present invention can be defined as L1+L2+L3. Here, L1 and L2 may be controlled by varying the depth of the source and drain regions 63. Thus, there is a sufficient process margin in the process of forming the gate electrode 57".

As described above, exemplary embodiments of the present invention provide an insulated gate electrode that fills a portion of a gate trench extending to an isolation layer across an active region, and covers at least one sidewall of the active region. A portion of the gate electrode, which covers the sidewall(s) of the active region, extends under a portion of the gate electrode, which crosses the active region. An insulating pattern is disposed on the gate electrode. The gate electrode, which is surrounded by the insulating pattern and the active region, may constitute a buried gate electrode. Also, the buried gate electrode may extend across the isolation layer and form a buried word line.

In this construction, the exemplary embodiments of the present invention can provide a semiconductor device with a larger effective channel width and effective channel length than conventional transistors and can significantly diminish difficulties caused by body effect. As a consequence, the semiconductor device according to the exemplary embodiments of the present invention can be structurally beneficial to high integration.

Having described the exemplary embodiments of the present invention, it is further noted that it is readily apparent to those of reasonable skill in the art that various modifications may be made without departing from the spirit and scope of the invention which is defined by the metes and bounds of the appended claims. For example, the present invention may be applied to another semiconductor device including a MOS field effect transistor (MOSFET) and a method of fabricating the same.

What is claimed is:

1. A semiconductor device comprising:
    an isolation layer disposed in a semiconductor device to define an active region;
    a gate electrode filling a portion of a gate trench and covering at least one sidewall of the active region, the gate trench crossing the active region and extending to the isolation layer;
    an insulating pattern disposed on the gate electrode source and drain regions disposed in the active region on both sides of the gate electrode, respectively; and a storage capacitor electrically connected to one of the source and drain regions,
    wherein a first portion of the gate electrode that covers at least one sidewall of the active region extends under a second portion of the gate electrode that crosses the active region.

2. The device according to claim 1 wherein the gate Wench comprises:
    an upper trench;
    an intermediate trench disposed under the upper trench and having a larger width than the upper trench; and
    a lower trench disposed under the intermediate trench and exposing the sidewall of the active region.

3. The device according to claim 2 further comprising a sidewall spacer covering a portion of the active region exposed by the upper trench.

4. The device according to claim 2, wherein the gate electrode covers the sidewall of the active region exposed by the lower trench.

5. The device according to claim 1, wherein a portion of the gate electrode that extends into the isolation layer is thicker than the second portion of the gate electrode, which crosses the active region.

6. The device according to claim 1, wherein the insulating pattern fills the remaining portion of the gate trench.

7. The device according to claim 1, wherein top surfaces of the source and drain regions are at a higher level than the gate electrode.

8. The device according to claim 1, wherein top surfaces of the source and drain regions are at substantially the same level as a top surface of the insulating pattern.

9. The device according to claim 1, wherein the first portion of the gate electrode is disposed on the isolation layer.

10. A method of fabricating a semiconductor device, comprising:
    forming an isolation layer defining an active region in a semiconductor substrate;
    forming a gate trench extending to the isolation layer across the active region;
    forming a gate electrode to fill a portion of the gate trench and cover at least one sidewall of the active region;
    forming an insulating pattern on the gate electrode; forming source and drain regions in the active region on both sides of the gate electrode, respectively; and forming a storage capacitor which is electrically connected to one of the source and drain regions,
    wherein a first portion of the gate electrode that covers at least one sidewall of the active region extends under a second portion of the gate electrode that crosses the active region.

11. The method according to claim 10, wherein forming the gate trench comprises:
    forming a mask pattern to partially expose the active region and the isolation layer;
    forming an upper trench by partially etching the active region and the isolation layer using the mask pattern as an etch mask; and
    forming an intermediate trench and a lower trench under the upper trench,
    wherein the lower trench is formed under the intermediate trench and exposes the sidewall of the active region.

12. The method according to claim 11, further comprising forming a sidewall spacer on a portion of the active region exposed by the upper trench.

13. The method according to claim 12, wherein the sidewall spacer is formed of a material having an etch selectivity with respect to the active region and the isolation layer.

14. The method according to claim 11, further comprising extending the intermediate trench using an isotropic etching process after forming the intermediate trench.

15. The method according to claim 11, further comprising extending the lower trench by etching the isolation layer using an isotropic etching process after forming the lower trench.

16. The method according to claim 10, wherein the forming of the gate electrode comprises:
    forming a preliminary gate electrode to fill the gate trench; and
    etching-back the preliminary gate electrode.

17. The method according to claim 10, wherein the forming of the insulating pattern comprises:
    forming an insulating layer to fill the remaining portion of the gate trench and cover the semiconductor substrate; and
    planarizing the insulating layer.

18. The method according to claim 10, wherein top surfaces of the source and drain regions are higher than the gate electrode.

* * * * *